United States Patent
Cheng

(10) Patent No.: US 11,296,252 B2
(45) Date of Patent: Apr. 5, 2022

(54) METHOD AND APPARATUS FOR CMOS SENSOR PACKAGING

(71) Applicant: Taiwan Semiconductor Manufacturing Company, Ltd., Hsinchu (TW)

(72) Inventor: Ching-Hung Cheng, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 22 days.

(21) Appl. No.: 16/050,890

(22) Filed: Jul. 31, 2018

(65) Prior Publication Data

US 2018/0351028 A1 Dec. 6, 2018

Related U.S. Application Data

(62) Division of application No. 13/693,591, filed on Dec. 4, 2012.

(51) Int. Cl.
*H01L 31/18* (2006.01)
*H01L 27/146* (2006.01)

(52) U.S. Cl.
CPC .......... *H01L 31/18* (2013.01); *H01L 27/1464* (2013.01); *H01L 27/14636* (2013.01); *H01L 27/14683* (2013.01)

(58) Field of Classification Search
CPC ............... H01L 31/18; H01L 27/14636; H01L 27/1464; H01L 27/14683
See application file for complete search history.

(56) References Cited

U.S. PATENT DOCUMENTS

| | | | |
|---|---|---|---|
| 7,964,926 B2 | 6/2011 | Kim | |
| 2010/0090338 A1 | 7/2010 | Koike et al. | |
| 2010/0190338 A1 | 7/2010 | Koike et al. | |
| 2010/0327383 A1 | 12/2010 | Hayasaki et al. | |
| 2011/0147927 A1 | 6/2011 | Hagihara | |
| 2011/0233702 A1* | 9/2011 | Takahashi | H01L 27/14636 257/432 |
| 2012/0217600 A1* | 8/2012 | Hongo | H01L 27/1464 257/432 |
| 2012/0248580 A1 | 10/2012 | Matsugai et al. | |
| 2012/0248581 A1 | 10/2012 | Sugiyama et al. | |
| 2012/0313208 A1 | 12/2012 | Kim et al. | |
| 2013/0026523 A1* | 1/2013 | Shiu | H01L 33/52 257/98 |
| 2014/0151840 A1 | 6/2014 | Cheng | |

* cited by examiner

*Primary Examiner* — Matthew C Landau
*Assistant Examiner* — Mark Hatzilambrou
(74) *Attorney, Agent, or Firm* — Slater Matsil, LLP

(57) ABSTRACT

Methods and apparatus for forming a bond pad of a semiconductor device such as a backside illuminated (BSI) image sensor device are disclosed. The substrate of a device may have an opening at the backside, through the substrate reaching the first metal layer at the front side of the device. A buffer layer may be formed above the backside of the substrate and covering sidewalls of the substrate opening. A pad metal layer may be formed above the buffer layer and in contact with the first metal layer at the bottom of the substrate opening. A bond pad may be formed in contact with the pad metal layer. The bond pad is connected to the pad metal layer vertically above the substrate, and further connected to the first metal layer of the device at the opening of the substrate.

20 Claims, 13 Drawing Sheets

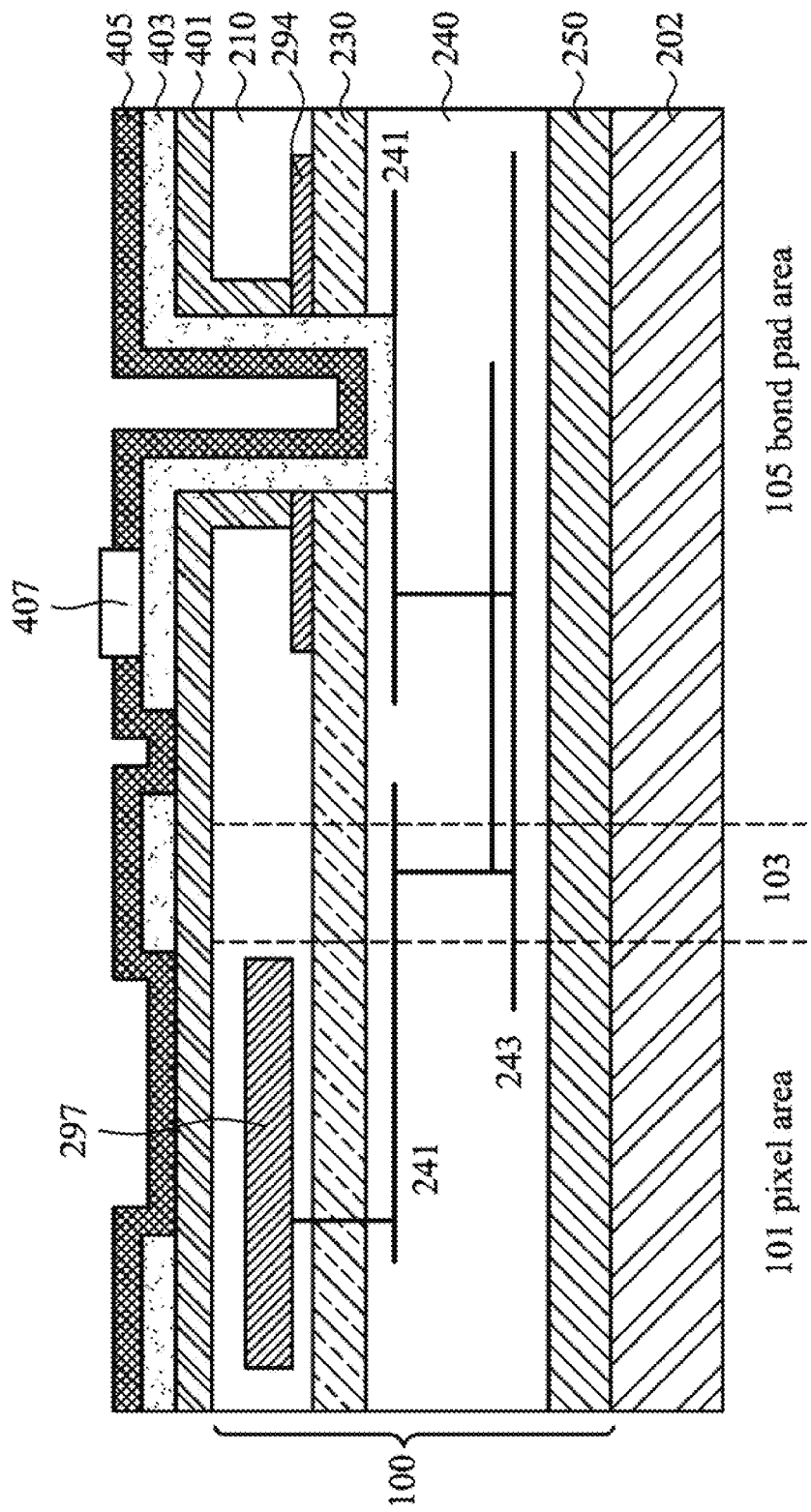

METHOD AND APPARATUS FOR CMOS SENSOR PACKAGING

PRIORITY CLAIM AND CROSS-REFERENCE

This application is a divisional of U.S. application Ser. No. 13/693,591, filed on Dec. 4, 2012 and entitled "Method and Apparatus for CMOS Sensor Packaging," which application is hereby incorporated by reference herein as if reproduced in its entirety.

BACKGROUND

Complementary metal-oxide semiconductor (CMOS) image sensors are gaining in popularity over traditional charged-coupled devices (CCDs). A CMOS image sensor typically comprises an array of pixels, which utilize light-sensitive CMOS circuitry to convert photons into electrons. The light-sensitive CMOS circuitry of a pixel typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. The electrons are converted into a voltage signal and further transformed into a digital signal.

A CMOS image sensor, which may be referred as a CMOS sensor, may comprise a plurality of dielectric layers and interconnect layers formed on the substrate, connecting the photo diodes in the substrate to peripheral circuitry. The side having the dielectric layers and interconnect layers is commonly referred to as a front side, while the side having the substrate is referred to as a backside. Depending on the light path difference, CMOS image sensors can be classified as front-side illuminated (FSI) image sensors and back-side illuminated (BSI) sensors.

In an FSI image sensor, light from the subject scene is incident on the front side of the CMOS image sensor, passes through dielectric layers and interconnect layers, and falls on the photo diode. In contrast, in a BSI image sensor, light is incident on the backside of the CMOS image sensor without the obstructions from the dielectric layers and interconnect layers. As a result, light can hit the photo diode through a direct path. Such a direct path helps to increase the number of photons converted into electrons, which makes the BSI CMOS sensor more sensitive to the light source.

CMOS sensors are becoming smaller and smaller, due to the continuous reductions of the sizes of the components (i.e., transistors, diodes, resistors, capacitors, etc.), therefore requiring smaller packages. Some smaller types of packages include quad flat pack (QFP), pin grid array (PGA), ball grid array (BGA), flip chips (FC), three dimensional integrated circuits (3DIC), wafer level packages (WLP), wafer-level chip scale packages (WLCSP), and package on package (PoP) devices. These package technologies may be used to achieve a high density required image sensor applications, or other sensor applications.

In a typical packaging process, interconnect structures are formed on metallization layers of the sensor, followed by the formation of contact pads or bond pads to establish electrical contacts between the sensor device and the substrate or lead frame of the package. Conventional bond pads and contact pads may be formed through the backside of the image sensors on the inter-layer dielectric layer and metal layers, which may have a thin support for the package. So formed bond pads may peel during or after bonding due to the fact that the bond pad strength is not strong enough. Methods and systems are needed to strengthen the bond pad support and improve the bonding.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 2(j) illustrates a BSI sensor device bond pad and an apparatus of a BSI sensor device bond pad in accordance with an embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1A:
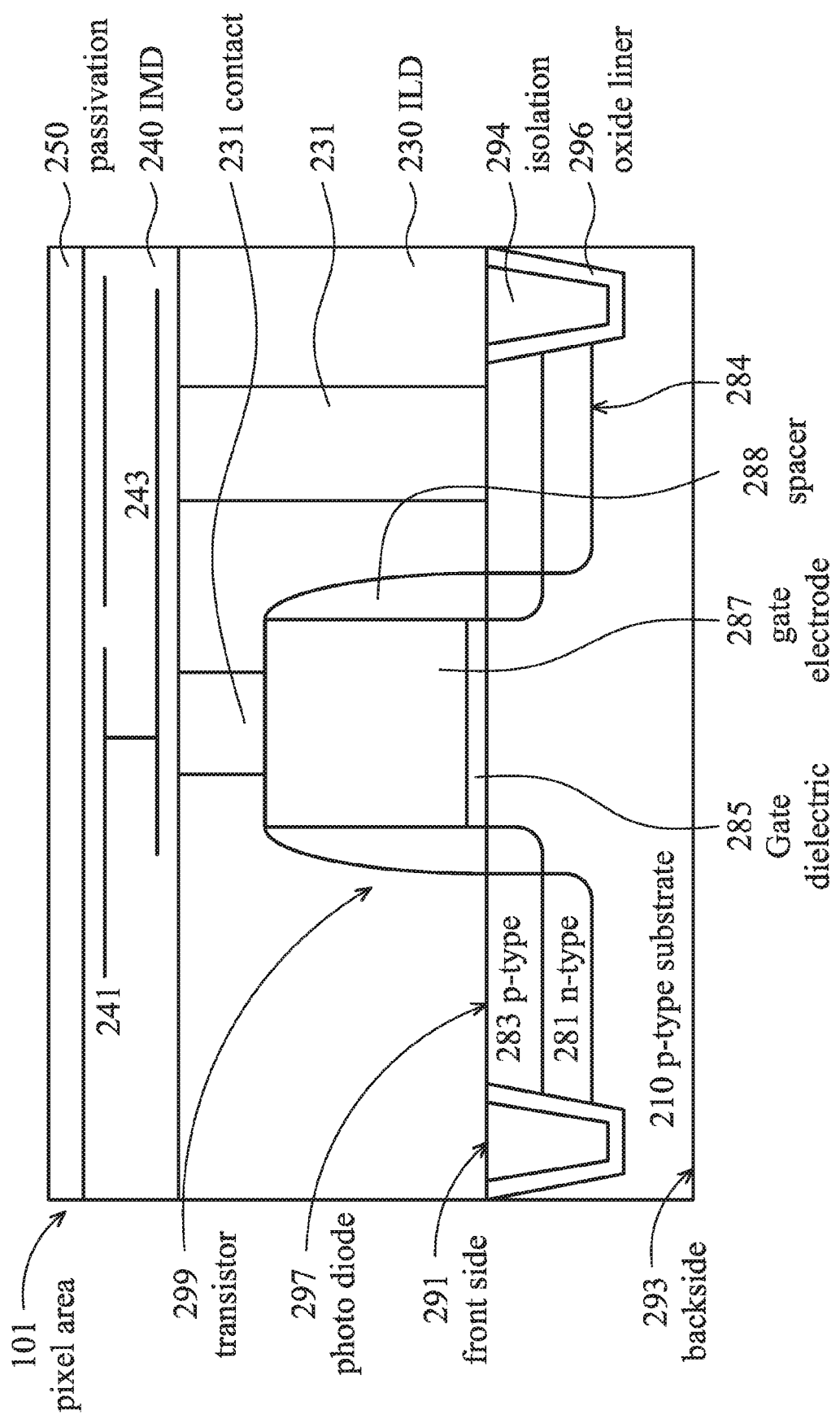
FIGS. 1(a)-1(c) illustrate a front side and a back side of a backside illuminated (BSI) sensor device.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure discloses methods and apparatus for a bond pad of a semiconductor device such as a backside illuminated (BSI) image sensor device. According to the embodiments, the substrate of the device may have an opening at the backside, through the substrate reaching the first metal layer at the front side. A buffer layer may be formed above the backside of the substrate and covering sidewalls of the substrate opening. A pad metal layer may be formed above the buffer layer and in contact with the first metal layer. A bond pad may be formed in contact with the pad metal layer. The bond pad is connected to the pad metal layer vertically above the substrate, and further connected to the first metal layer of the device at the opening of the substrate. The so formed bond pad is located vertically above the substrate, with a better support than a bond pad formed vertically above the first metal layer. The bond pad also has a better bondability to prevent pad peeling. No extra process and mask are needed in forming such a bond pad.

It will be understood that when an element or layer is referred to as being "on," "connected to" or "coupled to" another element or layer, it can be directly on, or connected or coupled to the other element or layer, or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

FIG. 1(a) illustrates a simplified cross-sectional view of an individual pixel area 101. An image sensor device may comprise a grid or array of such pixel areas, in addition to other areas such as a periphery area comprising logic circuit for periphery functions, and a bond pad area, as shown in FIG. 1(c). The pixel area 101 may be formed on a substrate 210 with a front side 291 and a back side 293. The substrate 210 may be a semiconductor material such as silicon, germanium, diamond, or the like. The substrate 210 may be doped with a p-type dopant, such as boron, aluminum, gallium, or the like, although the substrate may alternatively be doped with an n-type dopant, as is known in the art.

The substrate 210 may comprise a plurality of isolation areas 294 to separate and isolate various devices formed on the substrate 210, and also to separate the pixel area 101 from other logic parts of an image sensor device, such as the periphery area and the bond pad area in FIG. 1(c). The isolation areas 294 may be shallow trench isolations (STI) generally formed by etching the substrate 210 to form a trench and filling the trench with dielectric material as is known in the art. Optionally, an oxide liner 296 may be formed along the sidewalls of the isolation areas 294.

Within the pixel area 101, the substrate 210 may comprise a photosensitive diode 297, sometimes referred to as a photo-diode 297, which may generate a signal related to the intensity or brightness of light that impinges on the photosensitive diode 297. In an embodiment the photosensitive diode 297 may be a pinned layer photodiode. The pinned layer photodiode 297 may comprise an n-type doped region 281 formed in the substrate 210, which in this embodiment may be a p-type substrate. It also may comprise a heavily doped p-type region 283 (referred to as the pinned layer) formed on the surface of the n-type doped region 281 to form a p-n-p junction. As one of ordinary skill in the art will recognize, the pinned layer photodiode described above is merely one type of photosensitive diode 297 that may be used in the embodiments. For example, a non-pinned layer photodiode may alternatively be used. Any suitable photodiode may be utilized with the embodiments, and all of these photodiodes are intended to be included within the scope of the embodiments.

The pixel area 101 may comprise a transistor 299, which may be a transfer transistor, a reset transistor, a source follower transistor, or a select transistor. The transistor 299 may comprise a gate dielectric 285 adjacent the substrate 210, a gate electrode 287 over the gate dielectric, and spacers 288 along the sidewalls of the gate dielectric 285 and gate electrode 287. Gate dielectric 285 and gate electrode 287 may be formed and patterned on the substrate 210 by any suitable process known in the art.

A source/drain region 284 of the transistor 299 may be formed in the substrate 210 on an opposing side of the gate dielectric 285 from the photosensitive diode 297. In an embodiment in which the substrate 210 is a p-type substrate, the source/drain region 284 may be formed by implanting appropriate n-type dopants such as phosphorous, arsenic, antimony, or the like. It should be noted that one of ordinary skill in the art will realize that many other processes, steps, or the like may be used to form the source/drain region 284 and the photosensitive diode 297.

An inter-layer dielectric (ILD) layer 230 may be formed over the pixel area 101. The ILD layer 230 may comprise a material such as boron phosphorous silicate glass (BPSG), although any suitable dielectrics may be used for either layer. Contacts 231 may be formed through the ILD layer 230 with suitable photolithography and etching techniques. The contacts 231 may comprise a barrier/adhesion layer, not shown, to prevent diffusion and provide better adhesion for the contacts 231.

Various conductive and dielectric layers may be formed on the ILD layer 230, which are collectively referred to in FIG. 1(a) as the inter-metal dielectric (IMD) layer 240, to connect various devices to each other. Multiple metal layers such as the metal layer 241 and the metal layer 243 as shown may present in the IMD layer 240. There may be more metal layers than the two layers shown in FIG. 1(a). The metal layer 241 may be the first metal layer above the ILD layer 230 and the transistor 299. The first metal layer 241 may be connected to devices and components of the sensor device 100. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the ILD layer 230 and IMD layer 240, a passivation layer 250 may be formed in order to protect the underlying layers from physical and chemical damage. The passivation layer 250 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 250 may be formed through a process such as chemical vapor deposition (CVD), although any suitable process may be utilized.

Figure 1B:
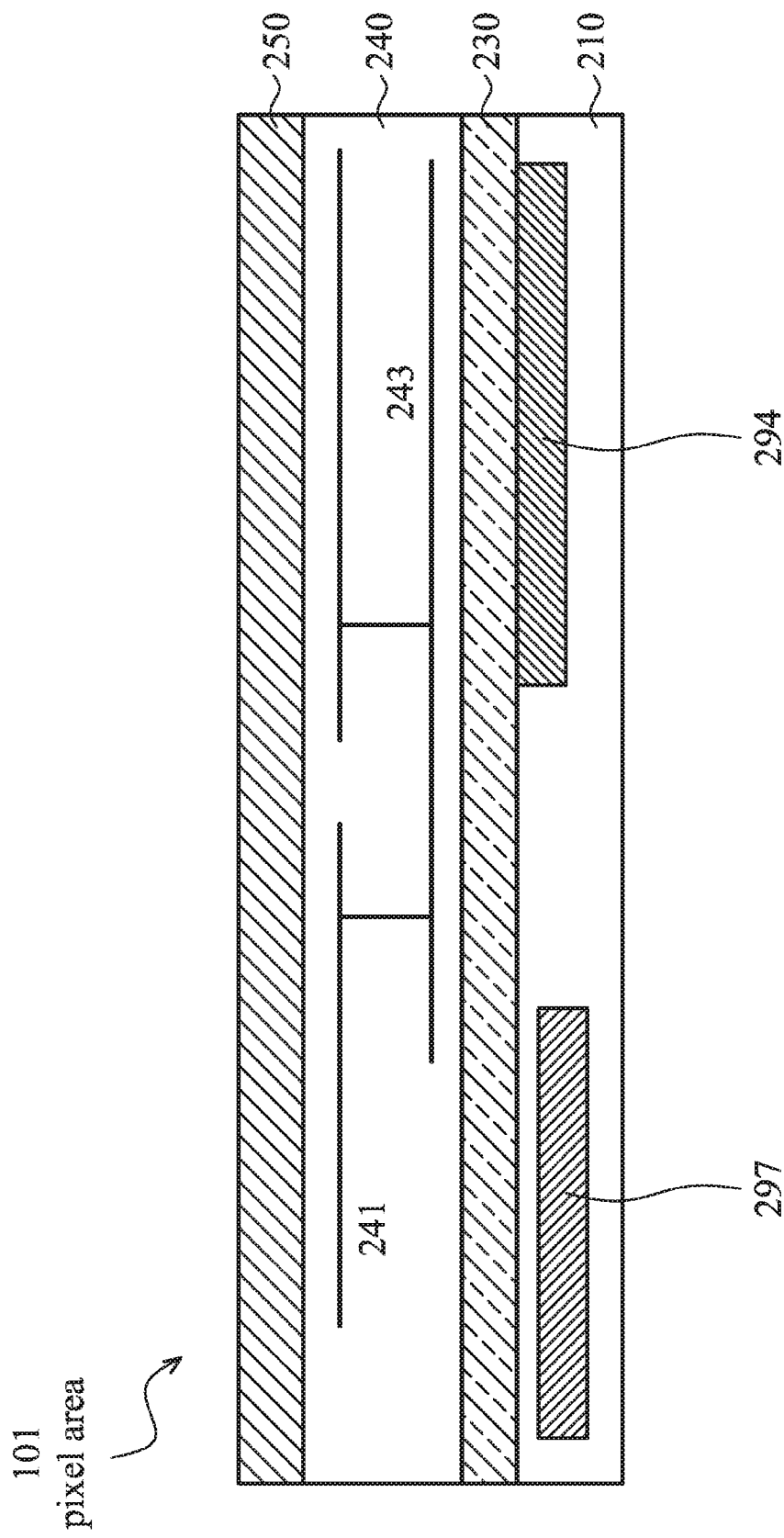
Figure 1C:
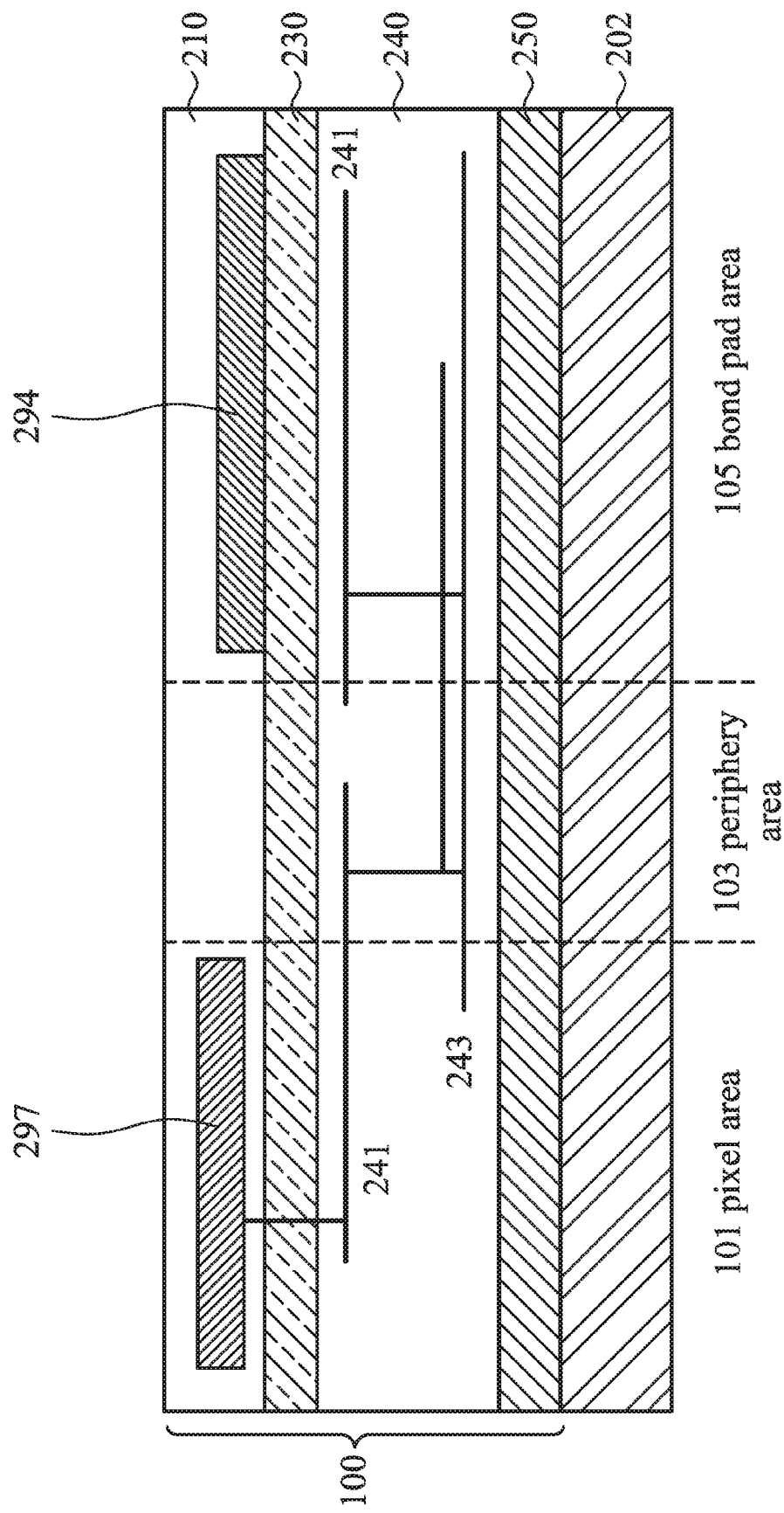

The detailed view illustrated in FIG. 1(a) is shown in a more abstract way in FIG. 1(b). The pixel area 101 may comprise a silicon substrate 210 with a photo diode 297 and a STI 294 formed within, an IDL layer 230, an IMD layer 240 that separates multiple levels of metallization such as the first metal layer 241 and the metal layer 243, and a passivation layer 250. Exemplary details of the layers 210, 230 and 240 are illustrated in FIG. 1(a). The ILD and IMD layers may alternatively be viewed as collectively forming a single dielectric layer. Various image sensor features such as interconnects, gates or other circuitry elements may be formed within a given dielectric layer using conventional techniques. The pixel area 101 may also be referred as a BSI sensor element in this disclosure since a BSI sensor element may be formed at the pixel region, and a BSI sensor or a BSI sensor device comprises a plurality of BSI sensor elements or pixels.

The pixel area 101 is only a part of a sensor device. As illustrated in FIG. 1(c) in a cross-sectional view, a sensor device 100 may comprise three different areas—the pixel area 101, the periphery area 103, and the bond pad area 105. Details of the pixel area 101 have been shown in FIG. 1(a). The periphery area 103 is an area where circuits for periphery functions may be located. Periphery functions may comprise digital-analog converters, timing generators, noise cancelers, and other similar functions. The bond pad area 105 is an area where a bond pad or a plurality of bond pads may be located to making bonding to a package frame.

As illustrated in FIG. 1(c), a carrier substrate 202 may be bonded to the BSI sensor device 100, which comprises a silicon substrate 210, an IDL layer 230, an IMD layer 240 that separates multiple levels of metallization, and a passivation layer 250 as illustrated in FIG. 1(b). The carrier substrate 202 may be bonded by a typical bonding process for coupling the carrier substrate 202 to the device 100 on the passivation layer 250. The carrier substrate 202 may be bonded directly on the IMD layer 240 instead of the passivation layer 250 in some other embodiments. The carrier substrate 202 may comprise, for example, a type of substrate commonly referred to as a handle substrate. In some other embodiments, the carrier substrate 202 may further comprise circuits moved from the device 100 to be on the carrier substrate 202 to reduce the size of the device 100 for cost reduction.

As illustrated in FIG. 1(c), the carrier substrate 202 together with the device 100 is flipped over so that the carrier substrate 202 is at the bottom providing support for the structure. The structure further undergoes an etch or thin down process to thin the substrate 210 at the backside such that light directed through the back surface thereof may effectively reach sensor elements formed within the substrate.

FIGS. 2(a)-2(i) illustrate a method for forming a BSI sensor bond pad at the backside of the substrate 210 on the sensor device 100 within the bond pad area 105 in accordance with an embodiment.

Figure 2A:
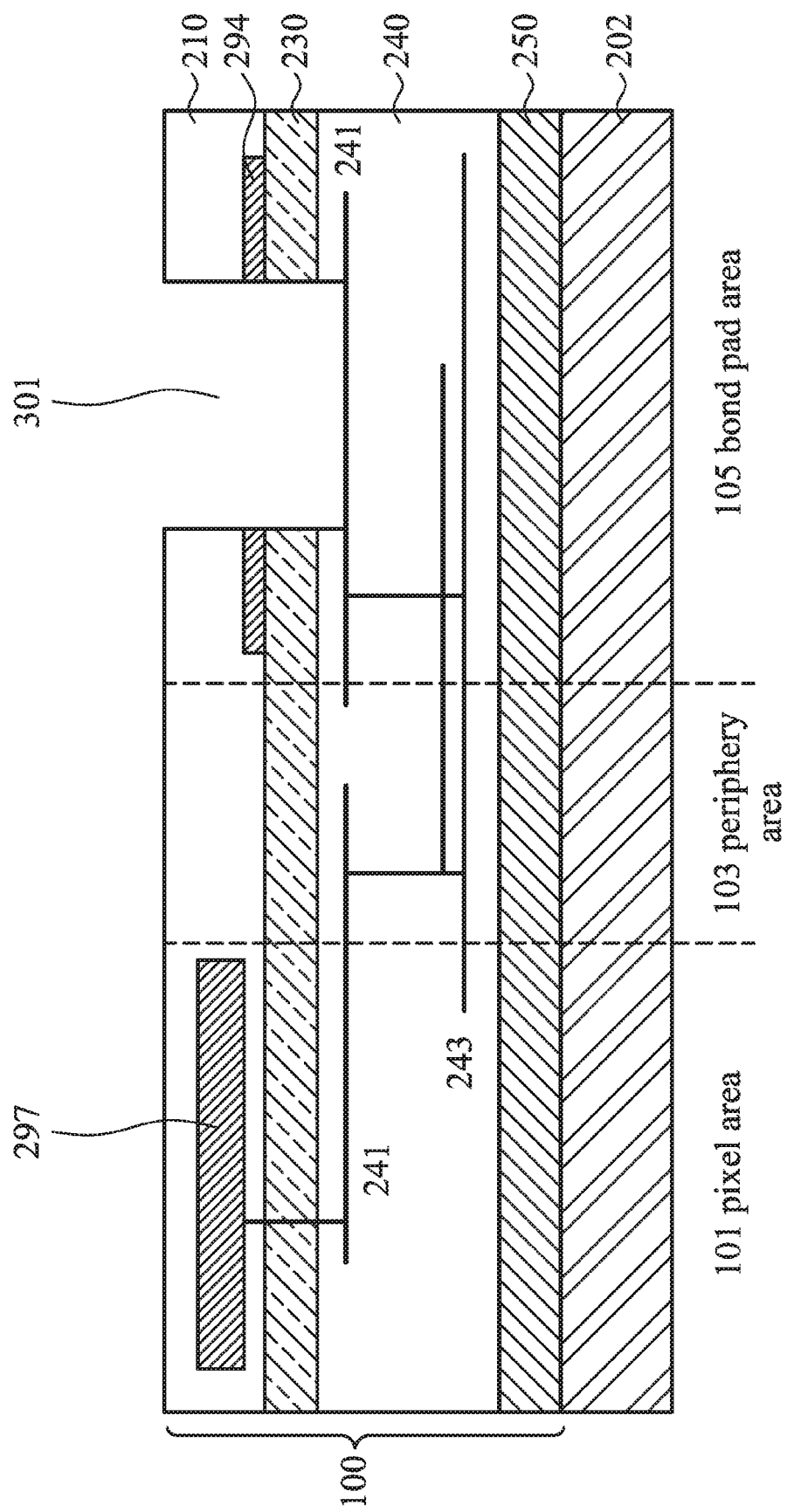
FIGS. 2(a)-2(i) illustrate a method for forming a BSI sensor device bond pad and an apparatus of a BSI sensor device bond pad in accordance with an embodiment.

As illustrated in FIG. 2(a) in a cross-sectional view, the sensor device 100 is bonded on the carrier substrate 202. The sensor device 100 has a pixel area 101 and a bond pad area 105. The sensor device 100 may further comprise a periphery area 103. The sensor device 100 may comprise a silicon substrate 210 with a photo diode 297 and a STI 294 formed within, an IDL layer 230, an IMD layer 240 that separates multiple levels of metallization such as the first metal layer 241 and the metal layer 243, and a passivation layer 250 bonded to the carrier substrate 202.

An opening 301 may be formed at the backside of the substrate 210, at the bond pad area 105, as shown in FIG. 2(a). The opening 301 is formed in the bond pad area 105 because there is no device within the bond pad area 105. The opening 301 may be formed using photolithography techniques and etching methods, which are well known to those skilled in the art and hence are not repeated herein. The opening 301 may go through the substrate 210. It may also go through the STI 294 and the ILD layer 230, reaching the first metal layer 241, so that the first metal layer 241 is exposed. The opening 301 may be formed through the STI 294 so that it would not interfere with any devices formed within the substrate since no device would be formed in the STI 294 area. The opening 301 may be shaped as a cup, i.e., the opening 301 may have a substantially circular shape when seen from above. Alternatively, it can be shaped as a rectangle, a square, a diamond, or any other shapes used in the art. The openings 301 may be at a range from about 80 um to about 100 um wide and about 3 um to 5 um deep in diameter. There may be more than one such opening. The number, the position, the size, the width, and the shape of the opening 301 are only for illustrative purposes only, but are not limiting.

Figure 2B:
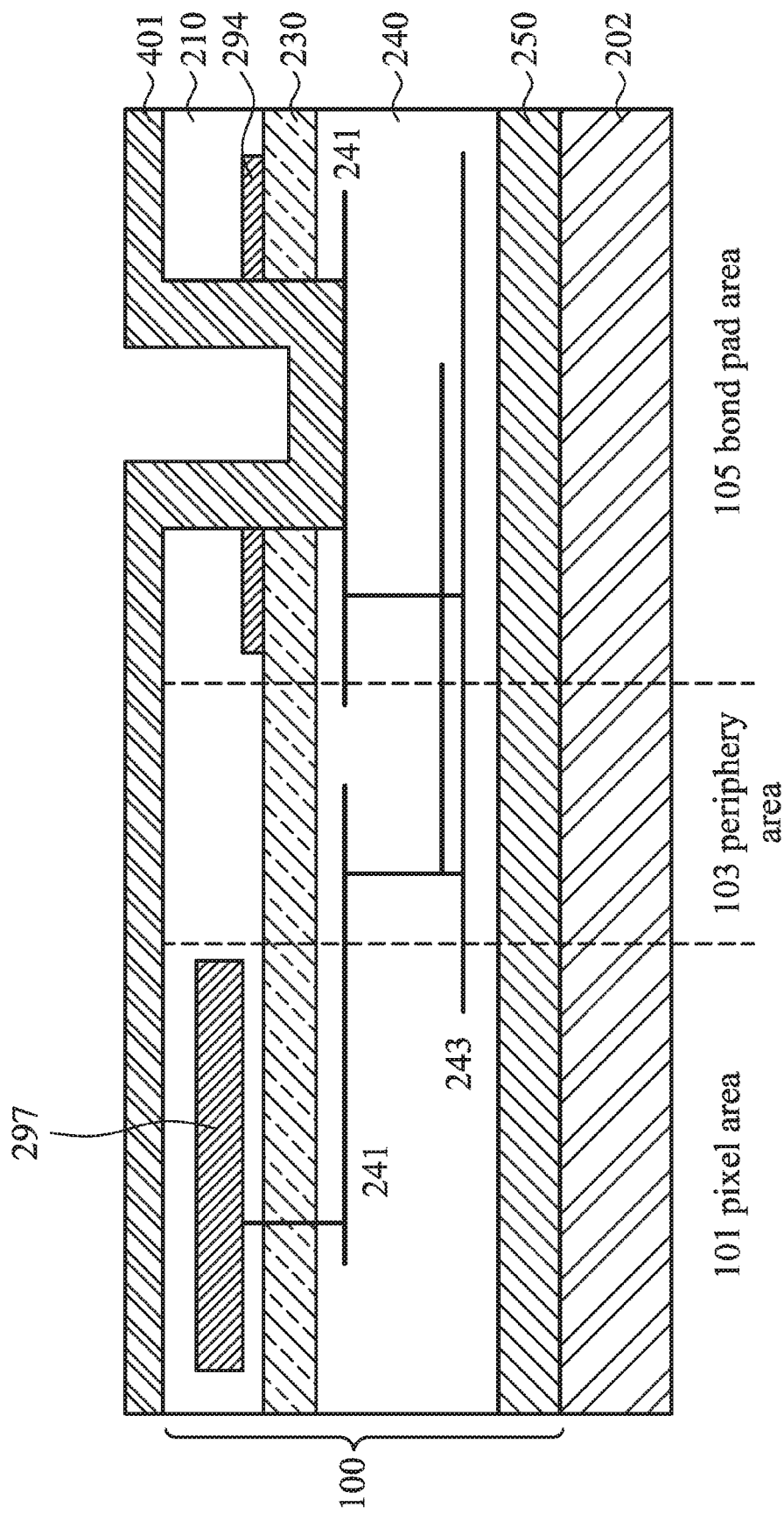

As illustrated in FIG. 2(b), a buffer layer 401 may be deposited above the backside of the substrate 210, covering the side walls and the bottom of the opening 301. The buffer layer 401 may be formed by conventional means including low-pressure CVD (LPCVD), plasma-enhanced CVD (PECVD), or atomic layer (ALCVD). The material for the buffer layer 401 may comprise $SiO_2$, SiN, SiON, SiC, or others, or combinations thereof. The buffer layer 401 may be formed over all the three areas: the pixel area 101, the periphery area 103, and the bond pad area 105. The buffer layer 401 may be deposited to a thickness between about 0.2 um to 0.5 um, such as 0.4 um. In some embodiments, the buffer layer 401 may be formed through the oxidation of substrate 210 (such as illustrated in FIG. 2(j)). Alternatively, the buffer layer 401 may also be formed to function as a backside passivation layer for electrical isolation between Si substrate and following pad metal and/or mechanical support and/or protection against moisture, or as an etch stop layer for subsequent processing. In one embodiment, the buffer layer 401 may be formed for protection and for reducing stress on the internal structure of the devices within the substrate.

Figure 2C:
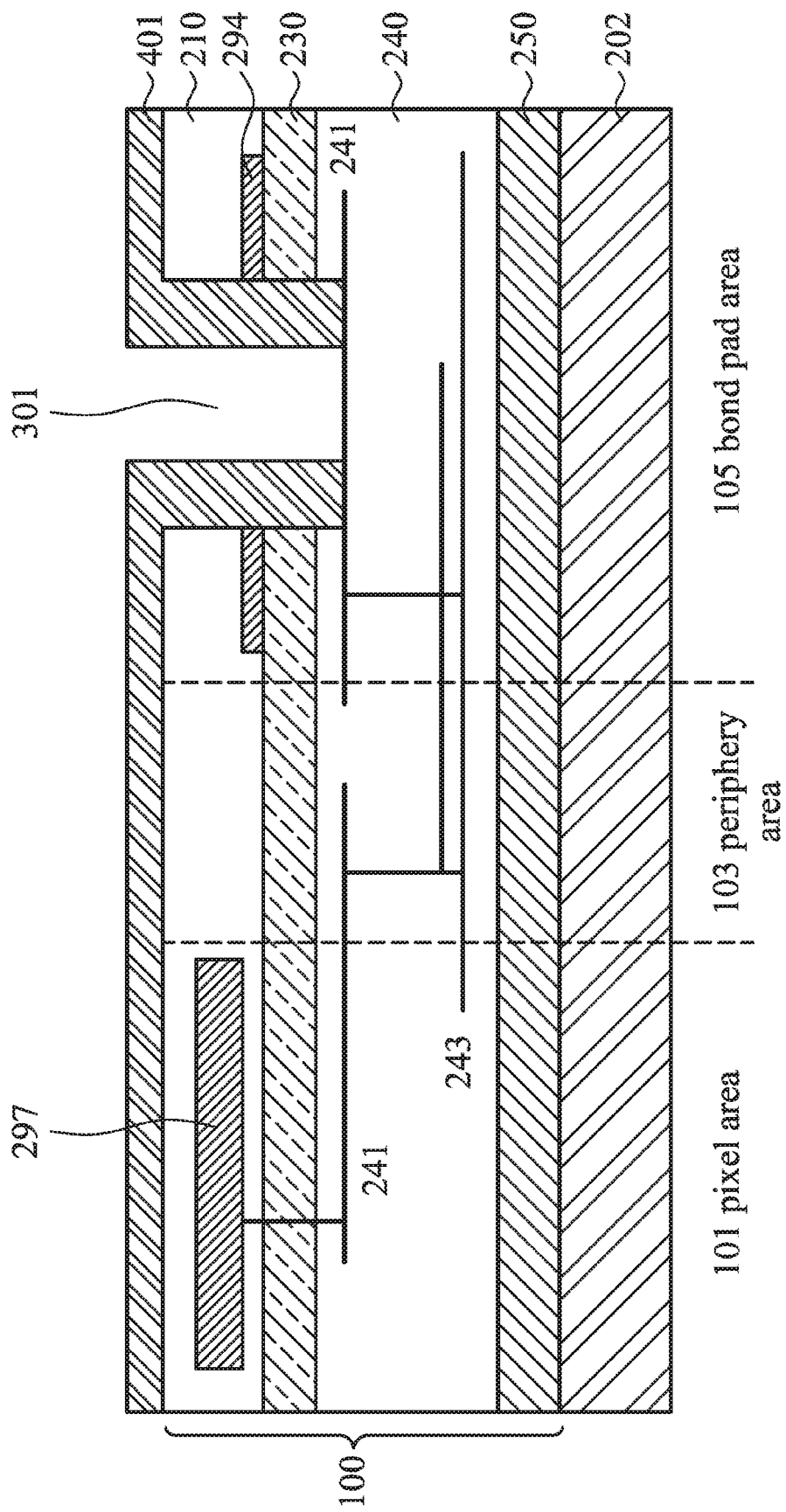

As illustrated in FIG. 2(c), the buffer layer 401 above the bottom of the opening 301 may be etched away to expose the first metal layer 241. The opening of the buffer layer 401 above the bottom of the opening 301 may be formed using photolithography techniques and etching methods, which are well known to those skilled in the art and hence are not repeated herein. The opening of the buffer layer 401 above the bottom of the opening 301 does not impact the part of the buffer layer 401 still covering the sidewalls of the opening 301.

Figure 2D:
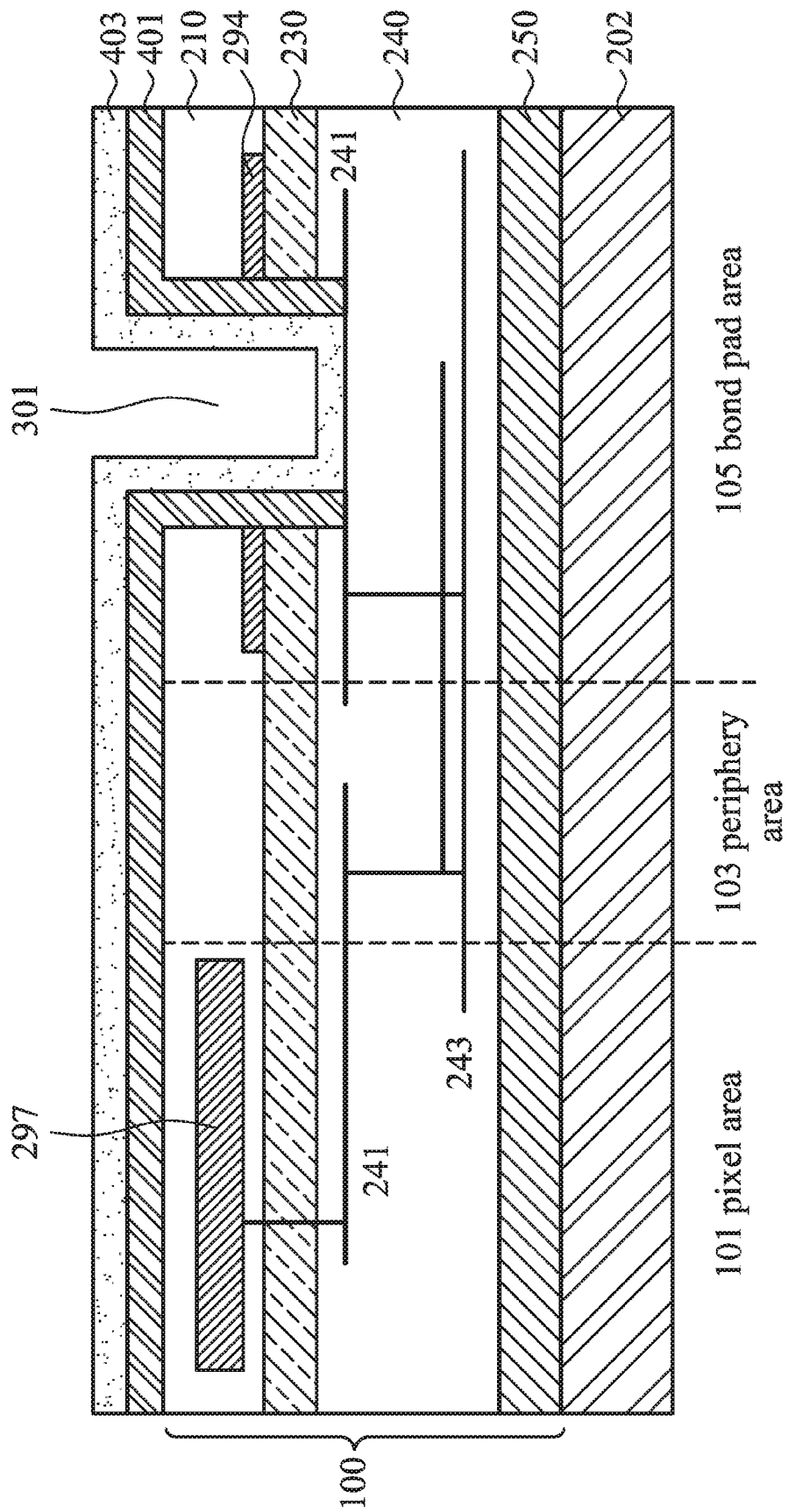

As illustrated in FIG. 2(d), a metal layer 403 may be formed above the buffer layer 401, covering the bottom of the opening 301, and in contact with the first metal layer 241. The metal layer 403 is used to form the electric connection between a bond pad and the first metal layer 241, therefore the metal layer 403 may be called a pad metal layer. The pad metal layer 403 may be made through any suitable process such as sputtering, evaporation, or PECVD process, depending upon the desired materials. The pad metal layer 403 may be formed to have a thickness of between about 0.2 μm to about 2 μm, such as about 1.2 μm. The pad metal layer 403 may be formed using suitable conductive materials such as aluminum, copper, nickel, gold, aluminum, or alloys thereof. The pad metal layer 403 may be formed over all the three areas: the pixel area 101, the periphery area 103, and the bond pad area 105.

Figure 2E:
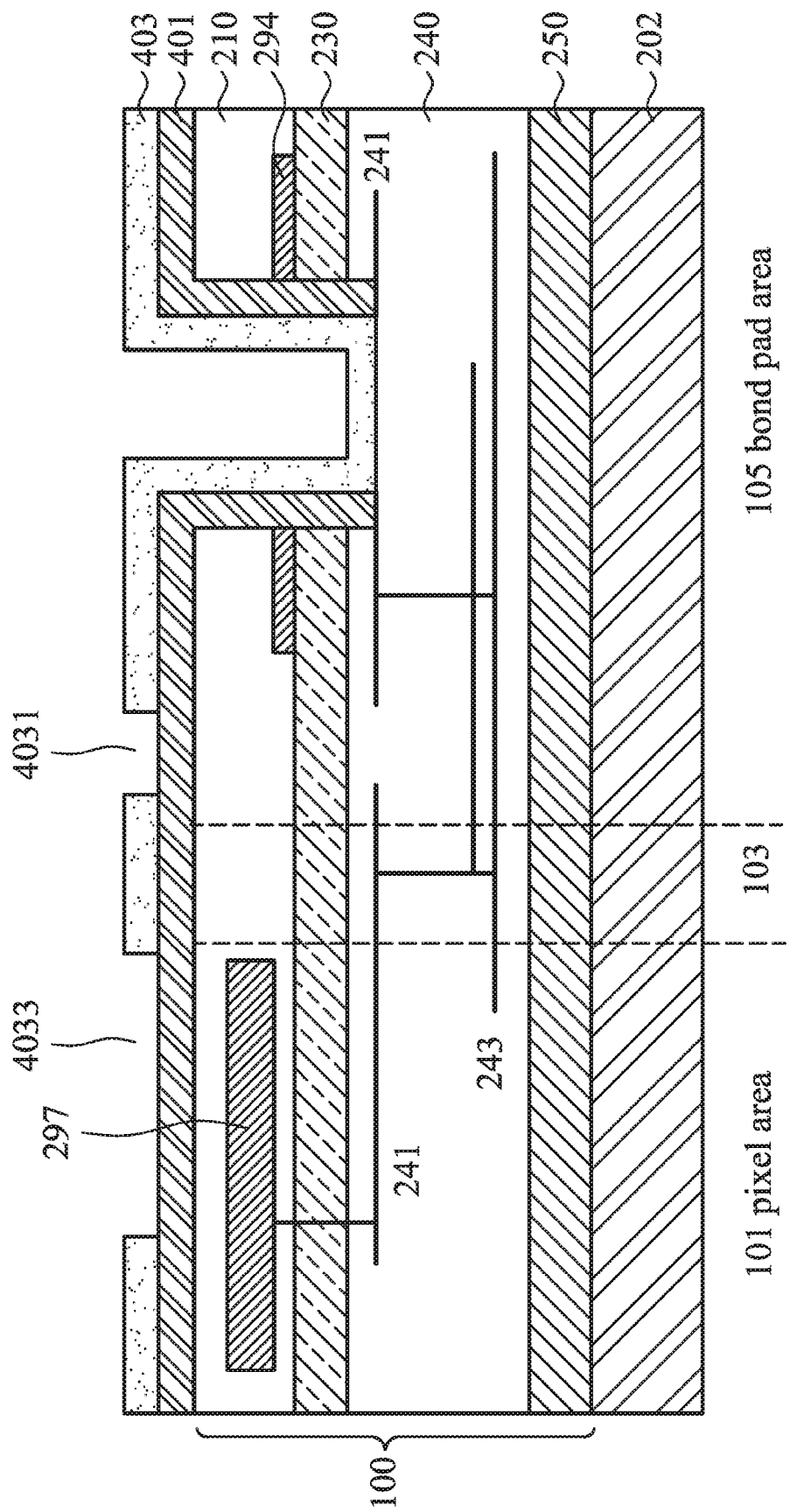
Figure 2F:
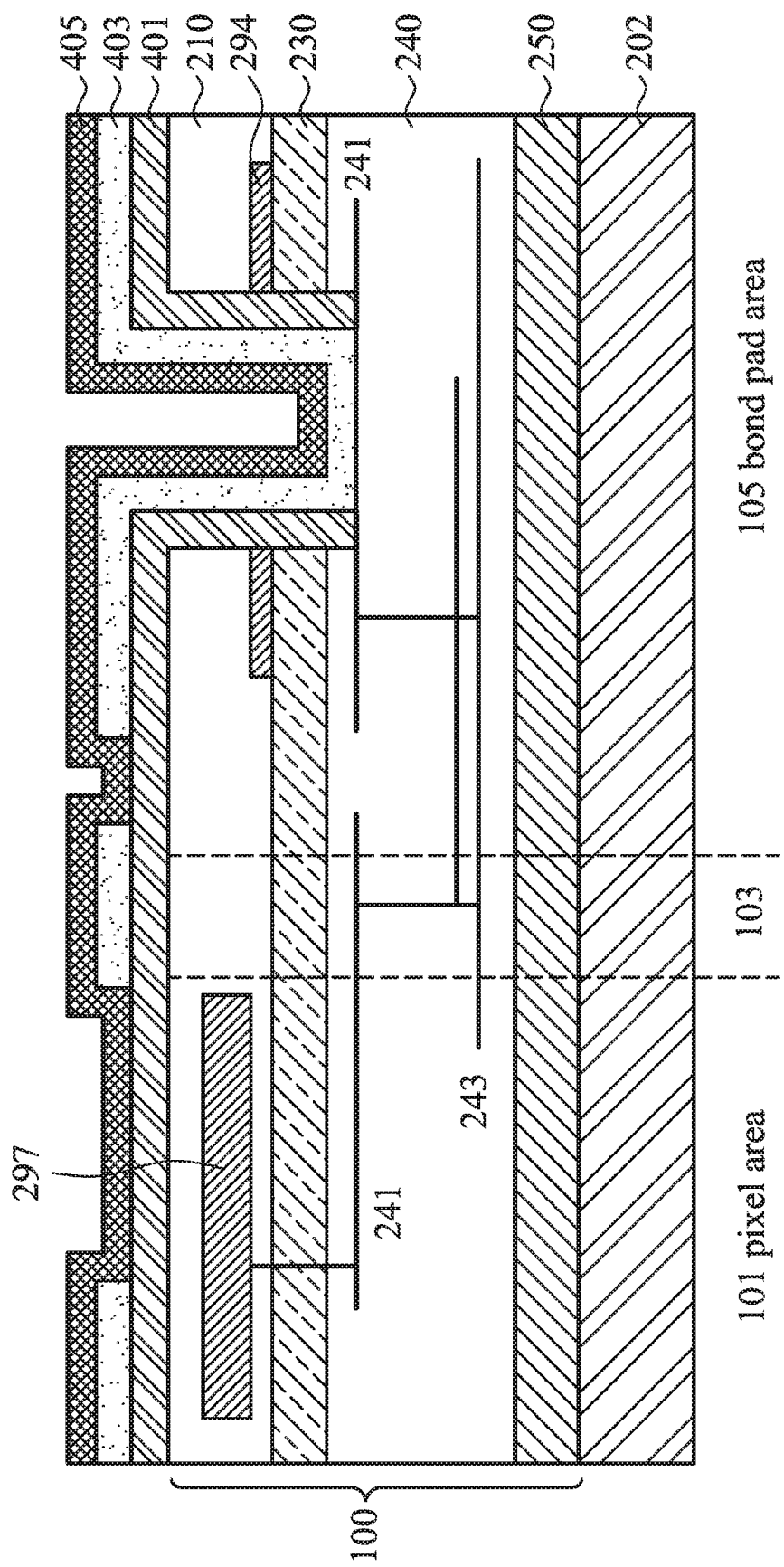
Figure 2G:
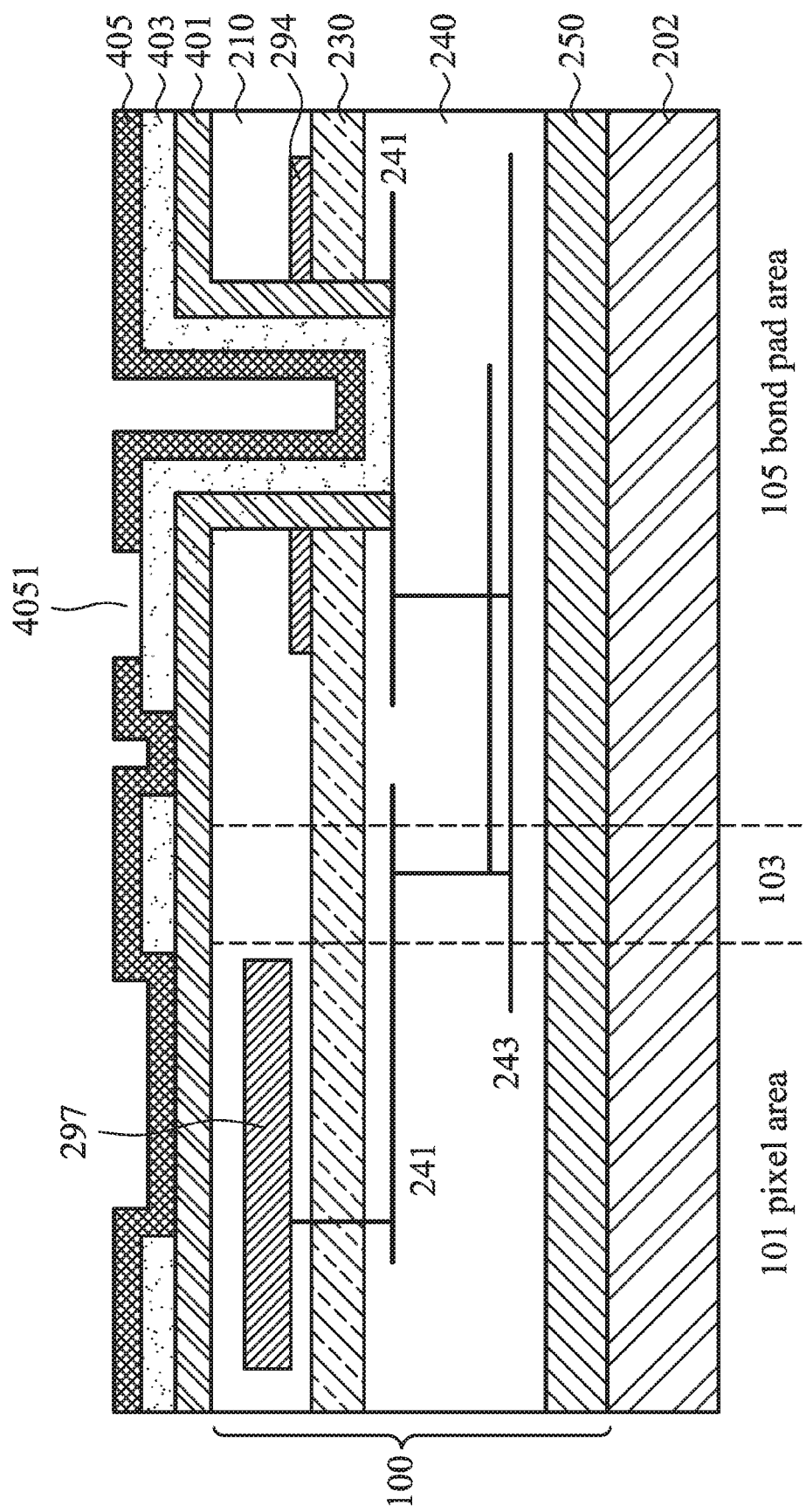
Figure 2H:
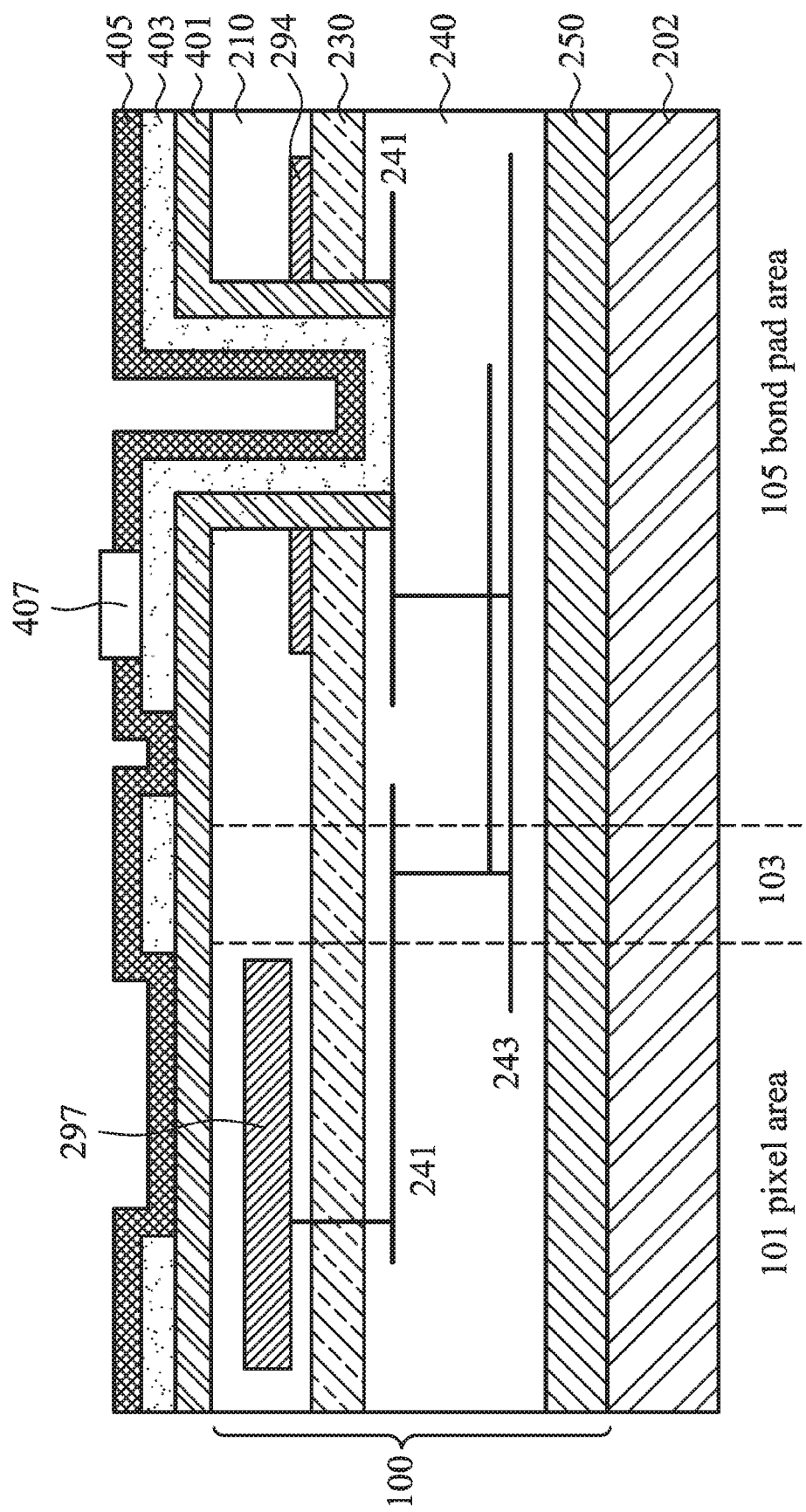
Figure 2I:
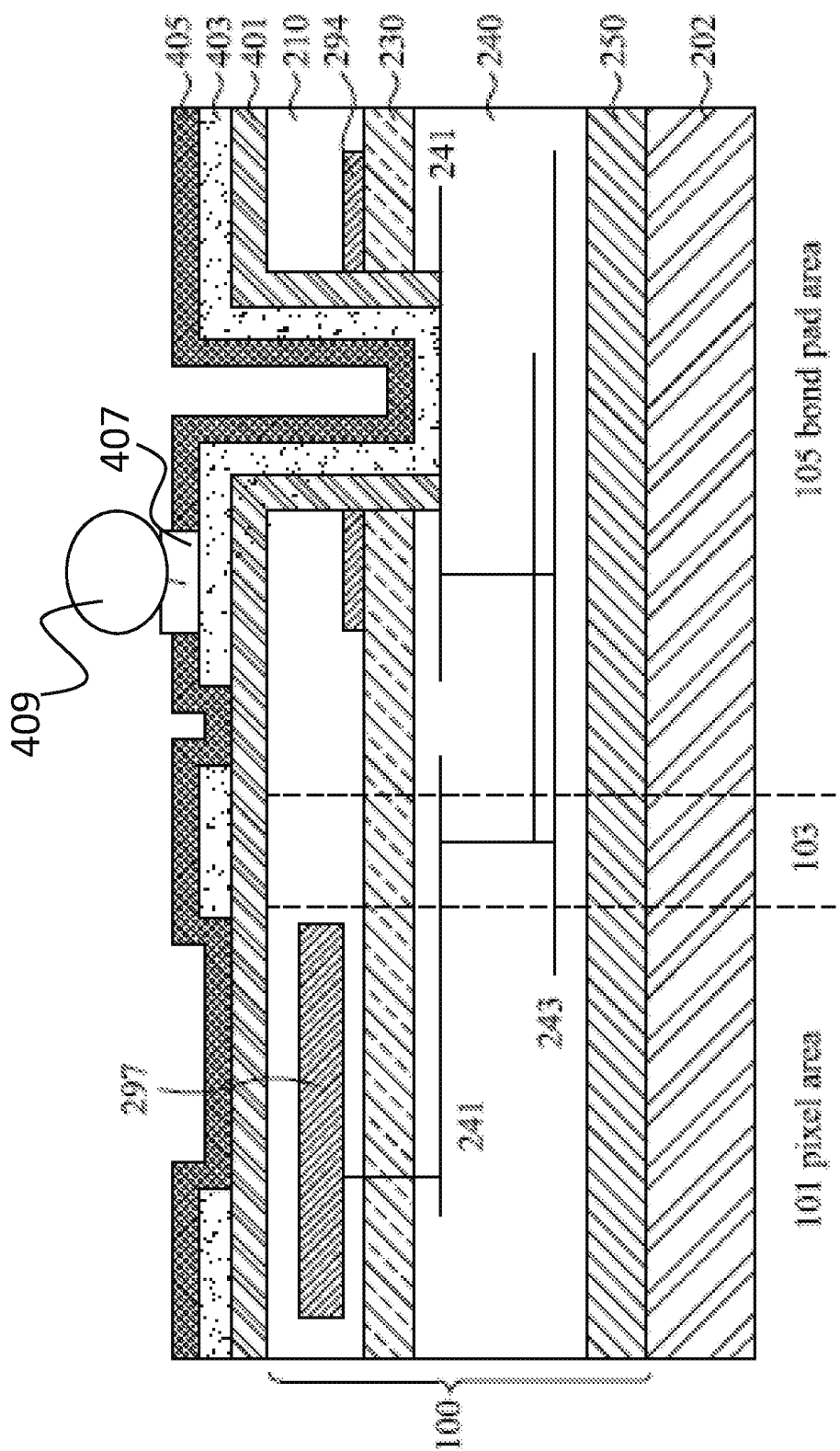

As illustrated in FIG. 2(e), two openings 4031 and 4033 may be formed on the pad metal layer 403 above the substrate 210 to expose the buffer layer 401. The openings 4031 and 4033 may be formed using photolithography techniques and etching methods, which are well known to those skilled in the art and hence are not repeated herein. The openings 4031 may be of a size from around 80 um to about 120 um, such as 100 um. The openings 4033 may be of a size from around 100 um to about 1000 um, such as 500 um. The opening 4031 may be located vertically above the bond pad area 105, separating the pad metal layer 403 into a segment vertically above the bond pad area 105. Similarly, the opening 4033 may be located vertically above the pixel area 101 to separate the metal layer 403 into a segment contained vertically above the pixel area 101. The openings 4031 and 4033 divide the pad metal layer 403 into different segments located vertically above different areas such as the pixel area 101 and the bond pad area 105, therefore no short circuit would result from the formation of the pad metal layer 403. The exact location of the openings 4031 and 4033 may depend on the functions of the sensor device 100.

As illustrated in FIG. 2(*f*), a passivation layer 405 may be formed over the pad metal layer 403, filling and covering the two openings 4031 and 4033 along their bottoms and sidewalls. The passivation layer 405 may be formed for structural support and physical isolation. The passivation layer 405 may be made of one or more suitable dielectric materials such as silicon oxide, silicon nitride, low-k dielectrics such as carbon doped oxides, combinations of these, or the like. The passivation layer 405 may be formed through a process such as chemical vapor deposition (CVD), although any suitable process may be utilized, and may have a thickness between about 0.1 μm and about 1 μm, such as about 0.2 um.

As illustrated in FIG. 2(*g*), an opening of the passivation layer 4051 may be made by removing a portion of the passivation layer 405 using a mask-defined photoresist etching process to expose the metal layer 403. The opening 4051 is made vertically above the bond pad area 105. It may be above the STI 294, or it may be just vertically above the substrate 210 within the bond pad area 105. The opening 4051 may be of a diameter size about 100 um. The opening 4051 is formed for placing a bond pad within the opening. The openings 4051 may be formed using photolithography techniques and etching methods, which are well known to those skilled in the art and hence are not repeated herein.

As illustrated in FIG. 2(*h*), a bond pad 407 may be formed within the opening 4051 formed in step shown in FIG. 2(*g*). The bond pad 407 may be located vertically above the bond pad area 105 of the substrate. The bond pad 407 may be used for wire bonding, gold stud bump, or any other kinds of connections. For example, a mounting stud, a conductive pillar, a solder ball, a micro-bump, or a controlled collapse chip connection (C4) bump may be placed on the bond pad 407 for further connections to other part of a package, as illustrated in FIG. 2(*i*). Furthermore, the bond pad 407 may be used in packages such as stacking IC, 3DIC, and package on package (PoP) devices.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    forming an inter-layer dielectric (ILD) layer on a front side of a substrate, the substrate having a photo sensor proximate to the front side, wherein the photo sensor is in a pixel area of the semiconductor device, wherein the substrate further comprises a peripheral device in a peripheral area of the semiconductor device, wherein the substrate has an isolation structure, wherein the isolation structure is a dielectric material with a homogenous composition, wherein the isolation structure extends continuously within, and completely fills, a space delimitated by an outermost sidewall of the isolation structure contacting the substrate;
    after forming the ILD layer, forming an inter-metal dielectric (IMD) layer on the ILD layer such that the ILD layer is between the IMD layer and the substrate, the IMD layer comprising a metal layer that is electrically coupled to the photo sensor;
    forming a first opening at a backside of the substrate opposing the front side, the first opening extending through the isolation structure of the substrate, through the ILD layer, and into the IMD layer to expose the metal layer, wherein a first width of the first opening measured between opposing sidewalls of the first opening is smaller than a second width of the isolation structure measured between opposing exterior sidewalls of the isolation structure facing away from the first opening;
    forming a buffer layer along sidewalls of the first opening and along the backside of the substrate;
    forming a pad metal layer on the buffer layer, the pad metal layer physically contacting the metal layer;
    forming a second opening through the pad metal layer in the pixel area and forming a third opening through the pad metal layer in a bond pad area of the semiconductor device;
    forming a first passivation layer extending along the pad metal layer, wherein the first passivation layer is formed to line sidewalls and bottoms of the second and the third openings;
    forming a bond pad in the first passivation layer, wherein the bond pad physically contacts the pad metal layer and is formed in the bond pad area of the semiconductor device, wherein the pixel area, the bond pad area, and the peripheral area of the semiconductor device are laterally separated, wherein the pad metal layer is a single layer with a first portion vertically aligned with the bond pad area, a second portion vertically aligned with the pixel area, and a third portion vertically aligned with the peripheral area, wherein the first portion, the second portion, and the third portion of the pad metal layer are separated from each other, wherein the third portion covers the peripheral area and is between the first portion and the second portion, wherein a lower surface of the second portion facing the substrate is level with a lower surface of the third portion facing the substrate; and after forming the bond pad, bonding an external connector to the bond pad.

2. The method of claim 1, wherein forming the buffer layer comprises:
depositing a dielectric material along the backside of the substrate and along the sidewalls and a bottom of the first opening; and
after depositing the dielectric material, removing a portion of the dielectric material at the bottom of the first opening to expose the metal layer.

3. The method of claim 2, wherein the dielectric material comprises SiO2, SiN, SiON, SiC, or combinations thereof.

4. The method of claim 1, wherein forming the buffer layer comprises oxidizing portions of the substrate exposed by the first opening and oxidizing portions of the substrate disposed along the backside of the substrate, wherein the oxidized portions of the substrate form the buffer layer.

5. The method of claim 4, wherein the oxidized portions of the substrate extend continuously along the sidewalls of the first opening and the backside of the substrate.

6. The method of claim 1, wherein forming the first passivation layer comprises conformally forming the first passivation layer over the pad metal layer, wherein the first passivation layer extends into the second and the third openings and contacts the buffer layer.

7. The method of claim 1, wherein forming the bond pad comprises:
forming a fourth opening in the first passivation layer to expose the pad metal layer; and
forming an electrically conductive material in the fourth opening of the first passivation layer.

8. The method of claim 1, further comprising, before forming the first opening, forming a second passivation layer on the IMD layer at the front side of the substrate and attaching the second passivation layer to a carrier.

9. The method of claim 1, wherein the metal layer is formed between a first surface of the IMD layer facing the substrate and a second surface of the IMD layer facing away from the substrate, wherein the metal layer is further from the substrate than the first surface of the IMD layer.

10. A method of forming a semiconductor device, the method comprising:
bonding a sensor device to a carrier, wherein the sensor device comprises:
a substrate having a photo diode in a pixel area of the substrate, an isolation feature in a bond pad area of the substrate, and a peripheral device in a peripheral area of the substrate, wherein the pixel area, the bond pad area, and the peripheral area are laterally separated, wherein the isolation feature comprises a homogenous dielectric material that completely occupies a space defined by an exterior perimeter of the isolation feature, wherein the exterior perimeter of the isolation feature defines an interface between the substrate and the isolation feature;
an inter-layer dielectric (ILD) layer on a front side of the substrate;
an inter-metal dielectric (IMD) layer on the ILD layer, wherein the ILD layer is between the substrate and the IMD layer, wherein the IMD layer comprises a metal layer that is electrically coupled to the photo diode; and
a first passivation layer on the IMD layer, wherein the first passivation layer is bonded to the carrier, and a backside of the substrate opposing the front side is exposed after the bonding;
forming a first opening at the backside of the substrate, the first opening extending from the backside of the substrate, through the isolation feature, through the ILD layer, and into the IMD layer, the first opening exposing the metal layer, wherein the first opening extends between, but does not contact, the exterior perimeter of the isolation feature;
after forming the first opening, forming a buffer layer along the backside of the substrate and along sidewalls of the first opening;
forming a pad metal layer along exposed surfaces of the buffer layer, the pad metal layer in physical contact with the metal layer;
forming a second opening through the pad metal layer in the pixel area and forming a third opening through the pad metal layer in the bond pad area; and
forming a second passivation layer on the pad metal layer, wherein the second passivation layer is formed to line sidewalls and bottoms of the second and the third openings, wherein the pad metal layer is a single layer with a first portion vertically aligned with the bond pad area, a second portion vertically aligned with the pixel area, and a third portion vertically aligned with the peripheral area, wherein the first portion, the second portion, and the third portion of the pad metal layer are spaced apart from each other, wherein the third portion is between the first portion and the second portion, wherein a lower surface of the second portion facing the substrate is level with a lower surface of the third portion facing the substrate.

11. The method of claim 10, further comprising:
forming a fourth opening in the second passivation layer to expose the pad metal layer, the fourth opening being formed in the bond pad area; and
forming a bond pad in the fourth opening of the second passivation layer and in contact with the pad metal layer.

12. The method of claim 10, wherein the first opening is formed between opposing sidewalls of the isolation feature of the substrate, wherein the homogenous dielectric material of the isolation feature extends continuously between the opposing sidewalls of the isolation feature, and there is no other intervening structure between the opposing sidewalls of the isolation feature.

13. The method of claim 10, wherein forming the buffer layer comprises oxidizing portions of the substrate disposed along the backside of the substrate and along the sidewalls of the first opening.

14. The method of claim 10, wherein the exterior perimeter of the isolation feature physically contacts the substrate.

15. The method of claim 11, further comprising bonding an external connector to the bond pad.

16. The method of claim 10, wherein forming the buffer layer comprises:
depositing a dielectric material along the backside of the substrate and along the sidewalls and a bottom of the first opening.

17. The method of claim 16, further comprising:
after depositing the dielectric material, removing a portion of the dielectric material at the bottom of the first opening to expose the metal layer.

18. A method of forming a semiconductor device, the method comprising:
bonding a first side of a sensor device to a temporary carrier, wherein the sensor device comprises:
a substrate with an optical sensor proximate to a front side of the substrate and in a pixel area of the substrate, wherein the substrate further has a shallow trench isolation (STI) in a bond pad area of the substrate and has a peripheral device in a peripheral area of the substrate, wherein the pixel area, the bond pad area, and the peripheral area are laterally separated from each other;

an inter-layer dielectric (ILD) layer on the front side of the substrate;

an inter-metal dielectric (IMD) layer on the ILD layer, wherein the ILD layer is between the IMD layer and the substrate, wherein the IMD layer includes a metal layer electrically coupled to the optical sensor; and a first passivation layer on the IMD layer, the IMD layer disposed between the ILD layer and the first passivation layer, the first passivation layer being bonded to the temporary carrier;

forming a first opening at a backside of the substrate, the first opening extending through the STI of the substrate, through the ILD layer, into the IMD layer, and exposing the metal layer, wherein the first opening extends through the STI without contacting an outermost perimeter of the STI;

forming a buffer layer along the backside of the substrate and along surfaces of the substrate exposed by the first opening;

forming a pad metal layer on the buffer layer and on the metal layer;

forming a second opening through the pad metal layer in the pixel area and forming a third opening through the pad metal layer in the bond pad area;

forming a second passivation layer on the pad metal layer, wherein the second passivation layer is formed to line sidewalls and bottoms of the second and the third openings, wherein the pad metal layer is a single layer with a first portion vertically aligned with the bond pad area, a second portion vertically aligned with the pixel area, and a third portion vertically aligned with the peripheral area, wherein the first portion, the second portion, and the third portion of the pad metal layer are laterally spaced apart from each other, wherein the third portion is between the first portion and the second portion, wherein a lower surface of the second portion facing the substrate is level with a lower surface of the third portion facing the substrate; and forming a bond pad in the second passivation layer, the bond pad electrically coupled to the pad metal layer.

19. The method of claim 18, wherein forming the buffer layer comprises oxidizing portions of the substrate at the backside of the substrate and oxidizing portions of the substrate exposed by the first opening, wherein the oxidized portions of the substrate form the buffer layer.

20. The method of claim 18, wherein the STI is a first dielectric material with a uniform composition, wherein the first dielectric material extends continuously between sidewalls of the substrate facing the STI.

* * * * *